United States Patent
Brobston et al.

(10) Patent No.: US 8,502,608 B2
(45) Date of Patent: Aug. 6, 2013

(54) TUNABLE POWER AMPLIFIER USING LAMINATE MEMS CAPACITORS

(75) Inventors: Michael Lee Brobston, Allen, TX (US); Robert W. Monroe, Richardson, TX (US)

(73) Assignee: Samsung Electronics Co., Ltd., Suwon-si (KR)

( * ) Notice: Subject to any disclaimer, the term of this patent is extended or adjusted under 35 U.S.C. 154(b) by 295 days.

(21) Appl. No.: 12/917,308

(22) Filed: Nov. 1, 2010

(65) Prior Publication Data

US 2012/0106524 A1    May 3, 2012

(51) Int. Cl.
*H03F 3/191*    (2006.01)

(52) U.S. Cl.
USPC .......................................... 330/305; 330/302

(58) Field of Classification Search
USPC ................................. 330/302, 305
See application file for complete search history.

(56) References Cited

U.S. PATENT DOCUMENTS

| | | | |
|---|---|---|---|
| 6,903,612 B2* | 6/2005 | Toncich et al. | 330/302 |
| 6,977,562 B2* | 12/2005 | Park | 333/32 |
| 6,992,543 B2* | 1/2006 | Luetzelschwab et al. | 333/32 |
| 8,072,285 B2* | 12/2011 | Spears et al. | 333/17.3 |
| 8,131,232 B2* | 3/2012 | Muhammad | 455/114.2 |
| 2004/0174220 A1* | 9/2004 | Toncich et al. | 330/305 |
| 2008/0094149 A1* | 4/2008 | Brobston | 333/17.3 |

* cited by examiner

*Primary Examiner* — Khanh V Nguyen (57) ABSTRACT

For use in a wireless network, a tunable power amplifier circuit includes a power amplifier transistor and a plurality of laminate MEMS (microelectromechanical system) capacitors coupled to the power amplifier transistor. The laminate MEMS capacitors are arranged in a tunable matching network and configured to provide a matching impedance for the power amplifier transistor. In some embodiments, the laminate MEMS capacitors are arranged in a binary array.

20 Claims, 10 Drawing Sheets

TUNABLE POWER AMPLIFIER USING LAMINATE MEMS CAPACITORS

TECHNICAL FIELD OF THE INVENTION

The present application relates generally to wireless communication networks and, more specifically, to the use of laminate MEMS capacitors in a tunable power amplifier in a wireless communication network.

BACKGROUND OF THE INVENTION

In current wireless infrastructure systems, most RF power amplifiers are designed for operation in a specific narrow band of frequency and for a particular air interface technology such as CDMA, GSM, WCDMA, WiMax, LTE, or others. With the current plans by wireless network operators to migrate to LTE service by initially overlaying this service with existing 2G or 3G service, there is an incentive for operators to deploy equipment that can be reconfigured to operate across multiple bands or to be reconfigured for various air interface waveforms in order to avoid complete replacement of installed equipment.

A common issue in implementation of a multi-band or multi-mode power amplifier is in achieving optimum performance from the transmitter power amplifier over a broad frequency range or for multiple waveforms. The gain, linearity, and power added efficiency (PAE) performance of a power amplifier (PA) is heavily dependent on the complex load impedance presented to the transistors within the PA. Based on the characteristics of the transistors, a specific complex load impedance or narrow range of load impedance values will provide the optimum PAE. Often the optimum output power is achieved at a specific complex load impedance that is at a different impedance value than that required to achieve optimum PAE. Also, the optimum linearity performance in terms of error vector magnitude (EVM), adjacent channel power ratio (ACPR), or two tone intermodulation ratio (TTIR) is achieved at another possibly different load impedance than that required to achieve optimum PAE or output power. Since the final power amplifier in a radio transmitter is the dominant factor in the overall power consumption, efficiency, and linearity of the transmitter, it is normally critical to transform the actual impedance of the load through a matching network to present the ideal load impedance to the power amplifier transistors depending on which performance parameter must be optimized.

SUMMARY OF THE INVENTION

For use in a wireless network, a tunable power amplifier circuit is provided. The tunable power amplifier circuit includes a power amplifier transistor and a plurality of laminate MEMS (microelectromechanical system) capacitors coupled to the power amplifier transistor. The laminate MEMS capacitors are arranged in a tunable matching network and configured to provide a matching impedance for the power amplifier transistor.

For use in a wireless network, a base station is provided. The base station includes a base station controller and a base transceiver subsystem having a tunable power amplifier circuit. The tunable power amplifier circuit includes a power amplifier transistor and a plurality of laminate MEMS capacitors coupled to the power amplifier transistor. The laminate MEMS capacitors are arranged in a tunable matching network and configured to provide a matching impedance for the power amplifier transistor.

For use in a wireless communication network, a method of providing a matching impedance for a tunable power amplifier is provided. The method includes actuating at least one of a first plurality of laminate MEMS capacitors coupled to an input of a power amplifier transistor. The method also includes actuating at least one of a second plurality of laminate MEMS capacitors coupled to an output of the power amplifier transistor. The first and second pluralities of laminate MEMS capacitors are arranged in a tunable matching network.

Before undertaking the DETAILED DESCRIPTION OF THE INVENTION below, it may be advantageous to set forth definitions of certain words and phrases used throughout this patent document: the terms "include" and "comprise," as well as derivatives thereof, mean inclusion without limitation; the term "or," is inclusive, meaning and/or; the phrases "associated with" and "associated therewith," as well as derivatives thereof, may mean to include, be included within, interconnect with, contain, be contained within, connect to or with, couple to or with, be communicable with, cooperate with, interleave, juxtapose, be proximate to, be bound to or with, have, have a property of, or the like; and the term "controller" means any device, system or part thereof that controls at least one operation, such a device may be implemented in hardware, firmware or software, or some combination of at least two of the same. It should be noted that the functionality associated with any particular controller may be centralized or distributed, whether locally or remotely. Definitions for certain words and phrases are provided throughout this patent document, those of ordinary skill in the art should understand that in many, if not most instances, such definitions apply to prior, as well as future uses of such defined words and phrases.

BRIEF DESCRIPTION OF THE DRAWINGS

For a more complete understanding of the present disclosure and its advantages, reference is now made to the following description taken in conjunction with the accompanying drawings, in which like reference numerals represent like parts.

DETAILED DESCRIPTION OF THE INVENTION

FIGS. 1 through 12, discussed below, and the various embodiments used to describe the principles of the present disclosure in this patent document are by way of illustration only and should not be construed in any way to limit the scope of the disclosure. Those skilled in the art will understand that the principles of the present disclosure may be implemented in any suitably arranged wireless communication network.

The following document is hereby incorporated into the present disclosure as if fully set forth herein:

Guillermo Gonzalez, "Microwave Transistor Amplifiers, Analysis and Design", Prentice-Hall, Inc., 1984, hereinafter referred to as "Gonzalez".

Figure 1:
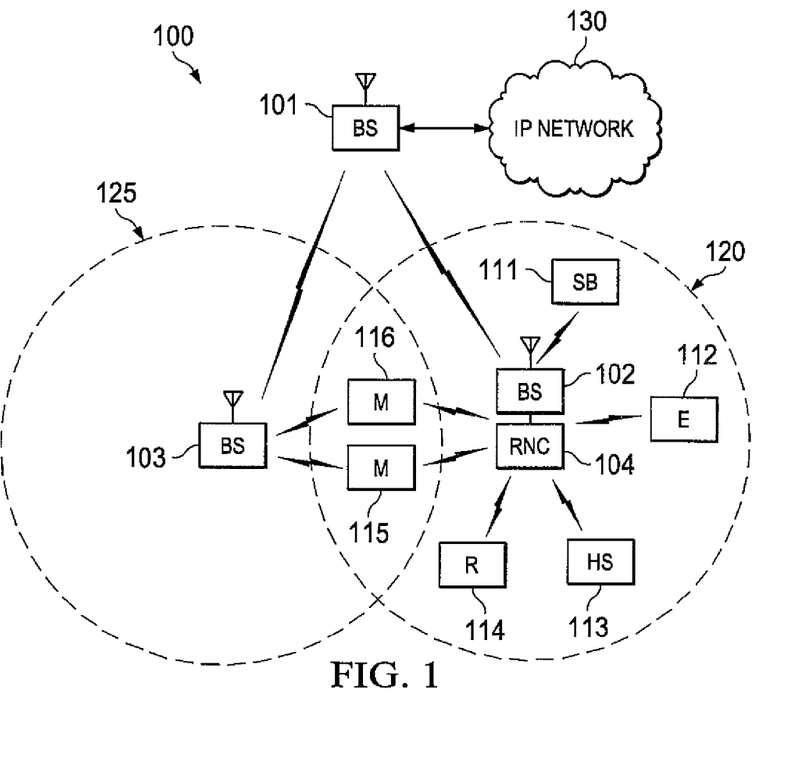
FIG. 1 illustrates an exemplary wireless network according to one embodiment of the present disclosure.

FIG. 1 illustrates an exemplary wireless network 100 according to one embodiment of the present disclosure. In the illustrated embodiment, wireless network 100 includes base station (BS) 101, base station (BS) 102, and base station (BS) 103. Base station 101 communicates with base station 102 and base station 103. Base station 101 also communicates with Internet protocol (IP) network 130, such as the Internet, a proprietary IP network, or other data network. Base station 102 communicates with Radio Network Controller (RNC) 104. In certain embodiments, RNC 104 may be a part of base station 102. In certain embodiments, base station 101 and base station 103 may also communicate with RNC 104. In other embodiments, base station 101 and base station 103 may include, or be in communication with, another radio network controller similar to RNC 104.

Base station 102, either in cooperation with RNC 104 or through RNC 104, provides wireless broadband access to network 130 to a first plurality of subscriber stations within coverage area 120 of base station 102. The first plurality of subscriber stations includes subscriber station (SS) 111, subscriber station (SS) 112, subscriber station (SS) 113, subscriber station (SS) 114, subscriber station (SS) 115 and subscriber station (SS) 116. Subscriber stations 111-116 may be any wireless communication device, such as, but not limited to, a mobile phone, mobile PDA and any mobile station (MS). In an exemplary embodiment, SS 111 may be located in a small business (SB), SS 112 may be located in an enterprise (E), SS 113 may be located in a Wi-Fi hotspot (HS), SS 114 may be located in a residence, and SS 115 and SS 116 may be mobile devices.

Base station 103 provides wireless broadband access to network 130, via base station 101, to a second plurality of subscriber stations within coverage area 125 of base station 103. The second plurality of subscriber stations includes subscriber station 115 and subscriber station 116. In alternate embodiments, base stations 102 and 103 may be connected directly to the Internet by means of a wired broadband connection, such as an optical fiber, DSL, cable or T1/E1 line, rather than indirectly through base station 101.

In other embodiments, base station 101 may be in communication with either fewer or more base stations. Furthermore, while only six subscriber stations are shown in FIG. 1, it is understood that wireless network 100 may provide wireless broadband access to more than six subscriber stations. It is noted that subscriber station 115 and subscriber station 116 are on the edge of both coverage area 120 and coverage area 125. Subscriber station 115 and subscriber station 116 each communicate with both base station 102 and base station 103 and may be said to be cell-edge devices interfering with each other. For example, the communications between BS 102 and SS 116 may be interfering with the communications between BS 103 and SS 115. Additionally, the communications between BS 103 and SS 115 may be interfering with the communications between BS 102 and SS 116.

Subscriber stations 111-116 may use the broadband access to network 130 to access voice, data, video, video teleconferencing, and/or other broadband services. In an exemplary embodiment, one or more of subscriber stations 111-116 may be associated with an access point (AP) of a Wi-Fi WLAN. Subscriber station 116 may be any of a number of mobile devices, including a wireless-enabled laptop computer, personal data assistant, notebook, handheld device, or other wireless-enabled device. Subscriber station 114 may be, for example, a wireless-enabled personal computer, a laptop computer, a gateway, or another device.

Dotted lines show the approximate extents of coverage areas 120 and 125, which are shown as approximately circular for the purposes of illustration and explanation only. It should be clearly understood that the coverage areas associated with base stations, for example, coverage areas 120 and 125, may have other shapes, including irregular shapes, depending upon the configuration of the base stations and variations in the radio environment associated with natural and man-made obstructions.

Also, the coverage areas associated with base stations are not constant over time and may be dynamic (expanding or contracting or changing shape) based on changing transmission power levels of the base station and/or the subscriber stations, weather conditions, and other factors. In an embodiment, the radius of the coverage areas of the base stations, for example, coverage areas 120 and 125 of base stations 102 and 103, may extend in the range from less than 2 kilometers to about fifty kilometers from the base stations.

As is well known in the art, a base station, such as base station 101, 102, or 103, may employ directional antennas to support a plurality of sectors within the coverage area. In FIG. 1, base stations 102 and 103 are depicted approximately in the center of coverage areas 120 and 125, respectively. In other embodiments, the use of directional antennas may locate the base station near the edge of the coverage area, for example, at the point of a cone-shaped or pear-shaped coverage area.

Although FIG. 1 depicts one example of a wireless network 100, various changes may be made to FIG. 1. For example, another type of data network, such as a wired network, may be substituted for wireless network 100. In a wired network, network terminals may replace BS's 101-103 and SS's 111-116. Wired connections may replace the wireless connections depicted in FIG. 1.

Figure 2:
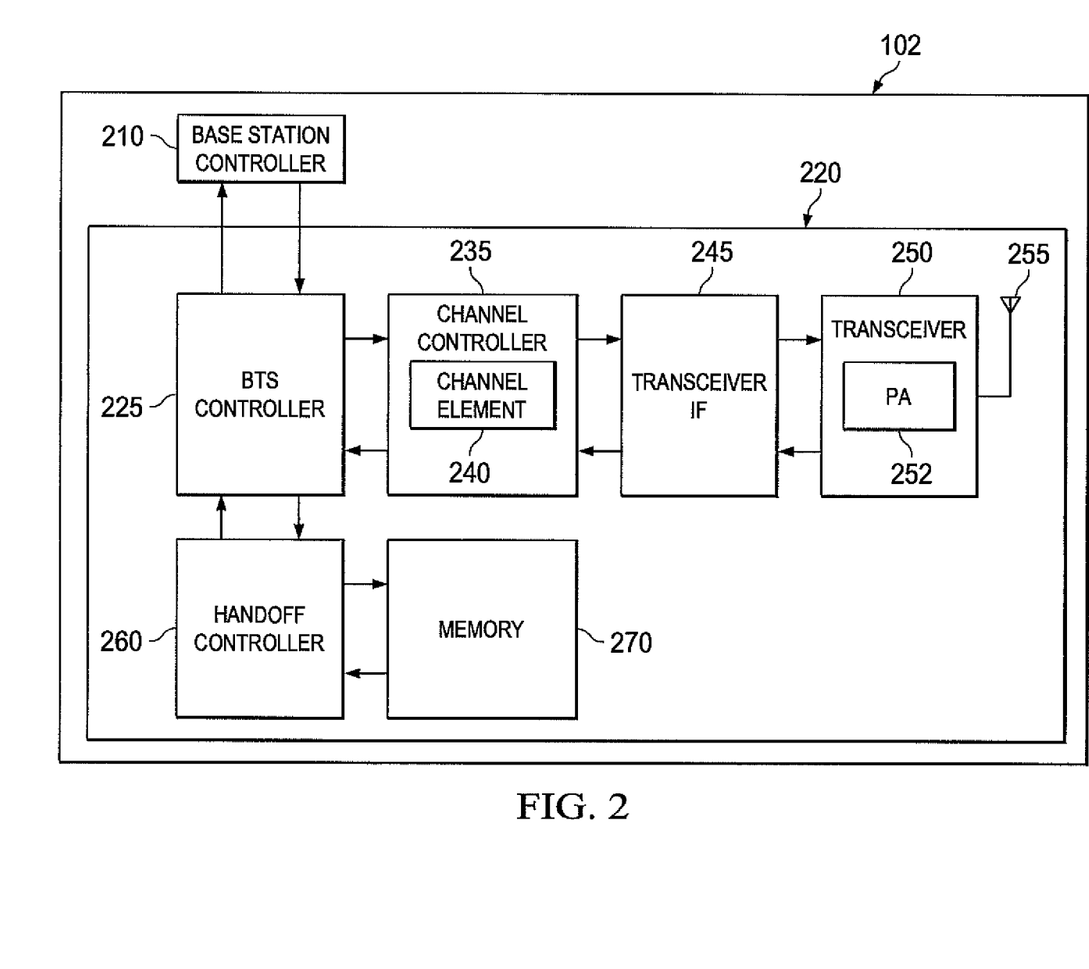
FIG. 2 illustrates an exemplary base station in greater detail according to one embodiment of this disclosure.
Figure 3:
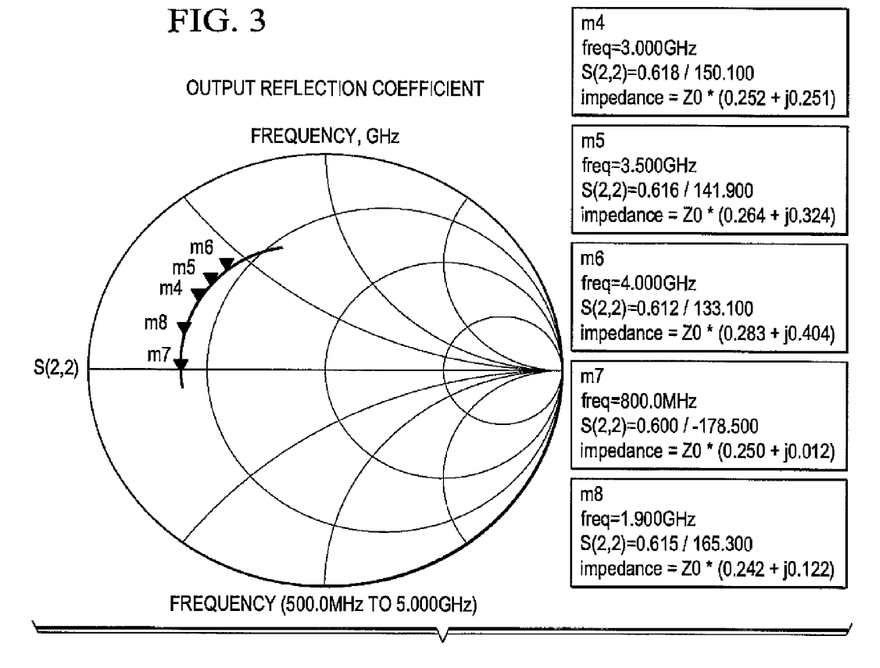
FIG. 3 shows a Smith Chart illustrating frequency dependent characteristics of a power amplifier.

FIG. 2 illustrates an exemplary base station in greater detail according to one embodiment of this disclosure. The embodiment of base station (BS) 102 illustrated in FIG. 2 is for illustration only. Other embodiments of the BS 102 could be used without departing from the scope of this disclosure.

BS 102 comprises a base station controller (BSC) 210 and a base transceiver subsystem (BTS) 220. A base station controller is a device that manages wireless communications resources, including base transceiver subsystems, for specified cells within a wireless communications network. A base transceiver subsystem comprises the RF transceivers, antennas, and other electrical equipment located in each cell site. This equipment may include air conditioning units, heating units, electrical supplies, telephone line interfaces, RF transmitters and RF receivers. For the purpose of simplicity and clarity in explaining the operation of this disclosure, the base transceiver subsystem and the base station controller associated with each base transceiver subsystem are collectively represented by BS 101, BS 102 and BS 103, respectively.

BSC 210 manages the resources in a cell site including BTS 220. BTS 220 comprises a BTS controller 225, a channel controller 235, a transceiver interface (IF) 245, an RF transceiver unit 250, and an antenna array 255. Channel controller 235 comprises a plurality of channel elements including an exemplary channel element 240. BTS 220 also comprises a handoff controller 260 and a memory 270. The embodiment of handoff controller 260 and memory 270 included within BTS 220 is for illustration only. Handoff controller 260 and memory 270 can be located in other portions of BS 102 without departing from the scope of this disclosure.

BTS controller 225 comprises processing circuitry and memory capable of executing an operating program that communicates with BSC 210 and controls the overall operation of BTS 220. Under normal conditions, BTS controller 225 directs the operation of channel controller 235, which contains a number of channel elements including channel element 240 that perform bi-directional communications in the forward channels and the reverse channels. A forward channel refers to a channel in which signals are transmitted from the base station to the mobile station (also referred to as DOWNLINK communications). A reverse channel refers to a channel in which signals are transmitted from the mobile station to the base station (also referred to as UPLINK communications). Transceiver IF 245 transfers the bi-directional channel signals between channel controller 240 and RF transceiver unit 250.

The embodiment of RF transceiver unit 250 as a single device is for illustration only. RF transceiver unit 250 may include separate transmitter and receiver devices without departing from the scope of this disclosure. RF transceiver unit 250 includes elements configured to process transmitted and/or received signals, including power amplifier (PA) 252.

Antenna array 255 transmits forward channel signals received from RF transceiver unit 250 to mobile stations in the coverage area of BS 102. Antenna array 255 also sends to transceiver 250 reverse channel signals received from mobile stations in the coverage area of BS 102. In some embodiments of this disclosure, antenna array 255 is a multi-sector antenna, such as a three-sector antenna in which each antenna sector is responsible for transmitting and receiving in a 120° arc of coverage area. Additionally, RF transceiver 250 may contain an antenna selection unit to select among different antennas in antenna array 255 during transmit and receive operations.

According to some embodiments of this disclosure, PA 252 includes a tunable matching network comprised of one or more laminate MEMS (microelectromechanical system) capacitors. This is described in greater detail below.

To create circuits with tunable RF capability, prior approaches have included use of tunable reactance devices such as varactor diodes, BST (Barium Strontium Titanate) devices, and silicon-based MEMS devices; or switched reactive circuits that include PIN diodes or GaAs switches. Each of these types of devices have linearity and power handling issues that prevent their use for RF power levels of greater than 5 watts. In addition, many of these devices have limited capacitive tuning range or limited quality factor that limits tuning range, RF loss, or other key circuit parameters. These limitations have prevented the implementation of tunable RF circuits such as power amplifiers for wireless infrastructure applications in which the average RF power is typically between 10 to 50 watts. Yet with the advent of cognitive radio, LTE Advanced, and other multi-band and multi-mode wireless infrastructure systems, it is clear that a high power solution is needed for tunable reactance devices. To implement a multi-band, multi-mode infrastructure power amplifier, it should be based on a tunable capacitor technology that has wide tuning range, good RF performance, and is able to handle average power levels up to 50 watts and peak power levels up to 280 watts.

A complicating factor in achieving optimum performance of a power amplifier over multiple bands or a single broad band is that the ideal load impedance of the power amplifier is different at different frequencies. This frequency dependent characteristic is illustrated in the Smith Chart shown in FIG. 3. Not only does the ideal load impedance of the PA transistor change as a function of operating frequency, but the impedance of the load and the characteristics of a fixed matching network also change with frequency. As a result, it is often difficult to achieve optimum power amplifier performance over a percentage bandwidth of greater than 5% to 10%.

Figure 4:
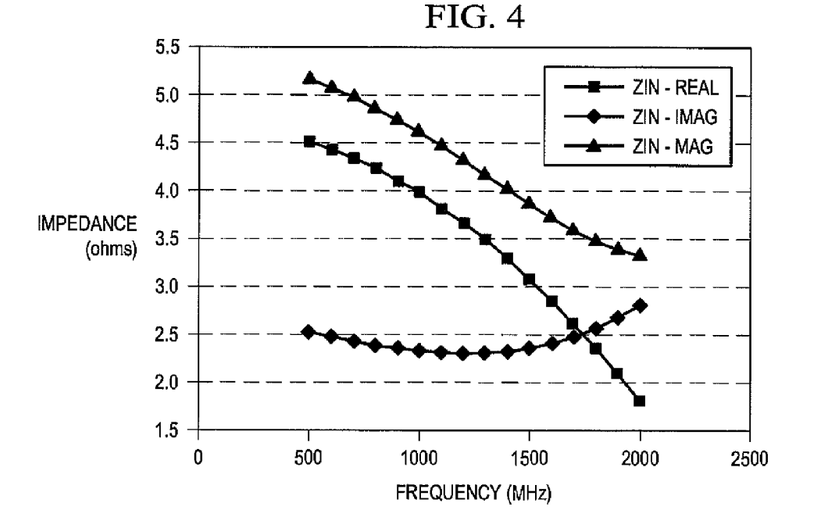
FIG. 4 shows the wideband impedance of a commercially available broadband high-voltage heterojunction bipolar transistor (HV-HBT)

The unmatched transistor of a power amplifier circuit can often provide operation over many octaves of bandwidth. The aspect of a power amplifier circuit that limits the optimum circuit bandwidth is often simply the capability to match the frequency dependent complex impedance characteristics of the transistor into the load over a wide range of frequencies. As an example, FIG. 4 shows the wideband impedance of a commercially available broadband high-voltage heterojunction bipolar transistor (HV-HBT) (e.g., T1H2005028-SP by TriQuint Semiconductor). The transistor shows substantial impedance variation versus frequency, which is typical of all transistor technologies (i.e., LDMOS (laterally diffused metal oxide semiconductor), GaN, GaAs, and the like).

One method for designing broadband matching networks is to use complex microwave filter synthesis techniques, such as described in Gonzalez. The matching filters present a frequency dependent complex impedance to the transistor that is similar in shape to the required frequency dependent impedance. However, these impedance matching filters require multiple impedance stages that dramatically increase the length of the matching networks (usually in such cases, both the Zin and Zout networks are greater than three inches each). Since modern day cellular PA designs require compact form factors, the length of broadband networks for the multiple transistor stages within the PA render this technique unacceptable.

Additionally, since a fixed matching circuit is typically constructed of some combination of lumped element inductors, capacitors, and distributed transmission line sections, each with a finite loss due to the inherent resistive aspects, each element or stage of the matching circuit can add insertion loss. Since any insertion loss between the power amplifier and the load reduces the power delivered to the load and the overall PAE, it is normally not practical to implement a complex multi-stage matching network due to the inherently higher insertion loss. While the bandwidth of optimum power amplifier performance can be broadened in this manner, the higher insertion loss of a complex matching circuit reduces the power delivered to the load at all of the operating frequencies.

Figure 5A:
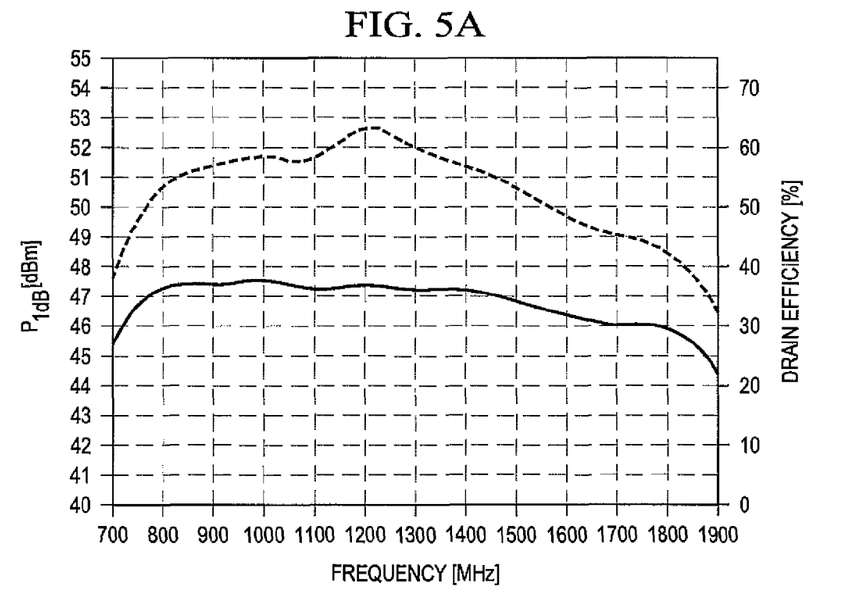
FIGS. 5A and 5B show 1 dB compression point, drain efficiency and gain for a commercial wideband power transistor using fixed matching networks.
Figure 5B:
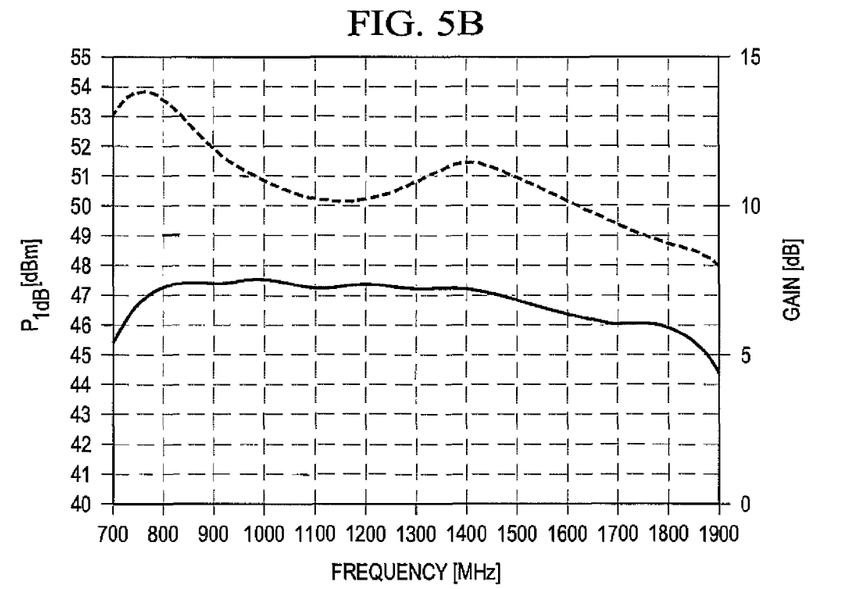

FIG. 5A shows the 1 dB compression point and drain efficiency over the 800 MHz-1500 MHz band for a commercial wideband power transistor using fixed matching networks. FIG. 5B shows the 1 dB compression point and gain over the same band for the same power transistor. FIGS. 5A and 5B illustrate the difficulty of trying to match a changing, frequency dependent impedance over wide bandwidths using fixed impedance matching networks.

In response to the inability to achieve optimum, low-loss, compact impedance matching networks, one proposal includes a tunable impedance matching network. By keeping the matching network a simple circuit containing a minimal number of components and by making some or all of these components tunable with respect to their impedance characteristics, it is possible to tune the matching network with an operating frequency to match the frequency dependent characteristics of the power amplifier device. Several approaches have been attempted to implement either a tunable or switchable matching network.

Various approaches have been proposed that use diode or semiconductor switches to switch various reactive elements (capacitors and inductors) either in or out of a matching circuit. These approaches have several limitations. The number of possible matching circuit states is limited by the number of diodes that can practically be implemented in the circuit. As the number of diodes or switches increases, so does the circuit size, cost, and insertion loss. Therefore it may not be practical to implement a circuit containing more than six to eight diodes or switches. Another disadvantage of using a semiconductor switch or diode as a switching element in a power amplifier matching network is that these devices have non-linearities which can degrade the overall transmitter EVM, ACPR, and TTIR even if they are able to survive the high peak power levels.

Another approach has been the use of variable capacitance elements such as varactor diodes. In a circuit implemented with variable capacitors such as varactor diodes, the diode's capacitance can be infinitely variable over a narrow range. This eliminates the need for switched reactance arrays and provides greater resolution to find the ideal matching value. However, matching circuits based on varactor diodes or other infinitely variable elements have certain limitations that make them undesirable.

First, the relationship of capacitance to control voltage or current is often not constant with temperature or frequency. This results in poor setting accuracy and repeatability. Second, any noise on the control line results in a modulation of the reactance which in turn results in additional carrier phase noise and degraded EVM. Third, since the envelope voltage of the modulated carrier from the power amplifier can easily reach levels comparable to the DC control voltage, additional non-linearity is caused by a detuning of the network at peaks of the modulated carrier envelope. Fourth, the variable capacitor elements induce non-linearities due to saturation or compression of the semiconductor device. These non-linearities further degrade the waveform EVM even if the varactors are scaled appropriately to survive the high peak power levels.

To overcome these shortcomings, embodiments of the present disclosure include one or more variable or switchable capacitors and switch elements constructed of laminate MEMS devices. In certain embodiments, a laminate MEMS (LMEMS) device is constructed of printed circuit board (PCB) materials in a PCB fabrication process, rather than the typical semiconductor or wafer scale MEMS device. By use of a PCB process, the laminate MEMS device's geometries, gaps, and metal thicknesses can be made much larger than is practical in MEMS devices based in semiconductor processes. For example, in one embodiment, a laminate MEMS device may be approximately 0.18 inches by 0.16 inches. Thus, a laminate MEMS device may support power levels that can exceed peaks of 200 watts (versus peak power levels of approximately 10 watts for conventional semiconductor or wafer MEMS devices).

Figure 6A:
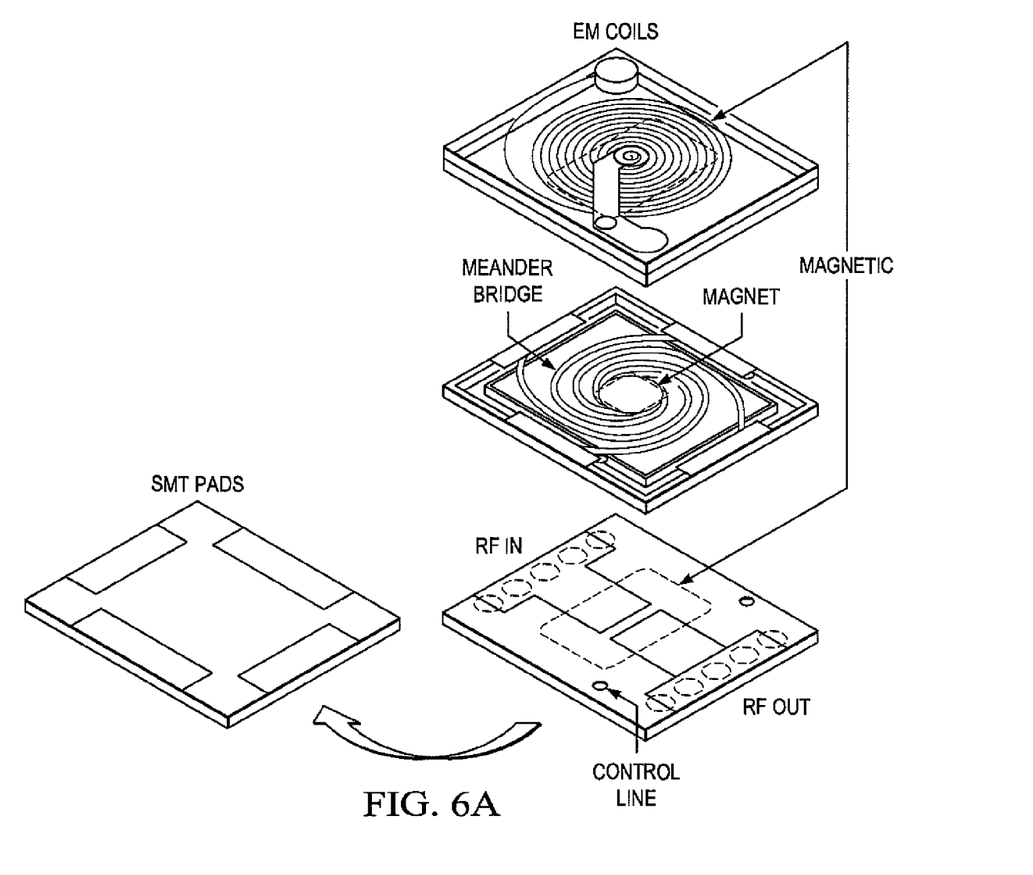
FIGS. 6A-6C illustrate laminate MEMS devices according to embodiments of the present disclosure.
Figures 6B, 6C:
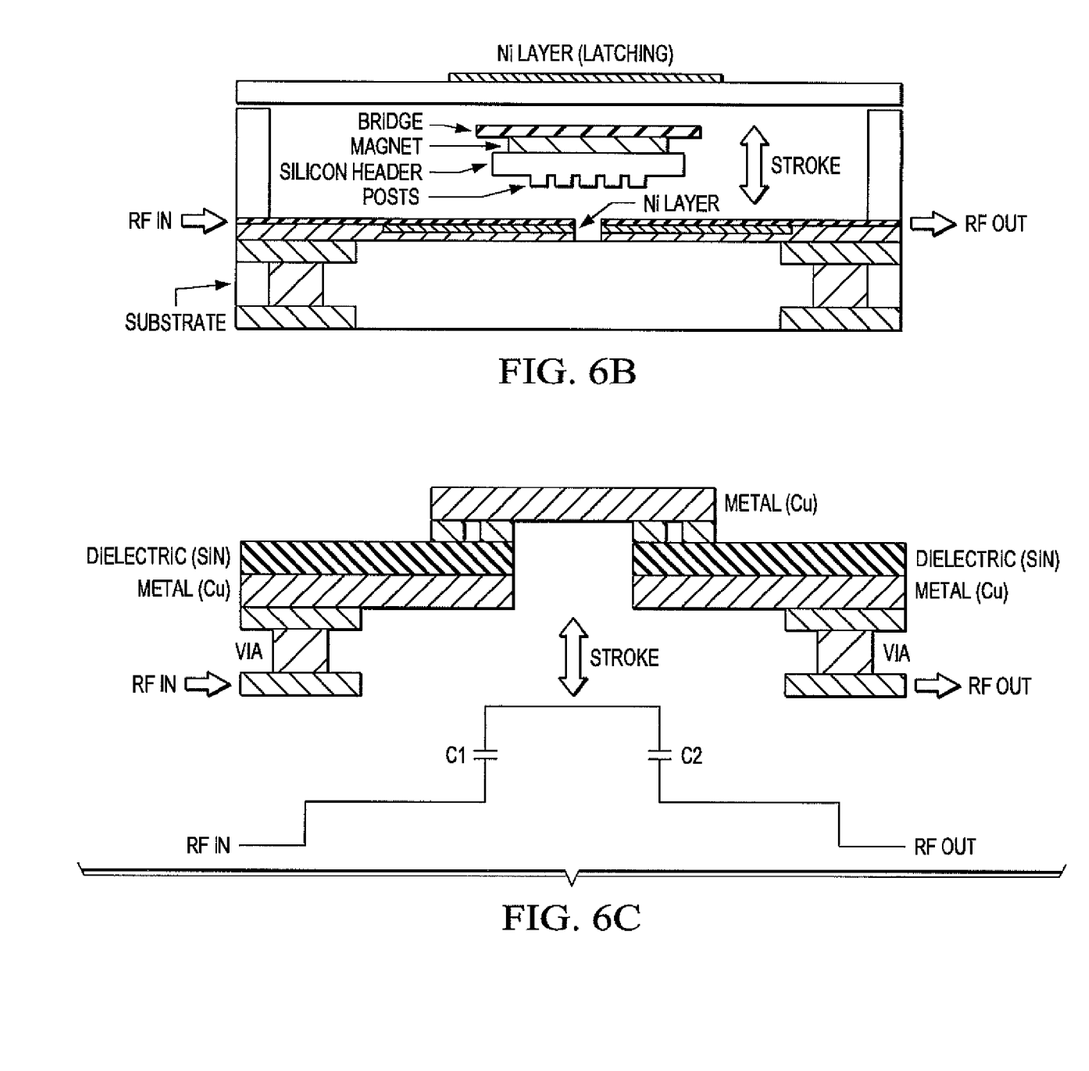

FIGS. 6A-6C illustrate laminate MEMS devices according to embodiments of the present disclosure. FIG. 6A depicts an exploded view of a laminate MEMS construction. FIG. 6B depicts a side view of a laminate MEMS device. FIG. 6C depicts a laminate MEMS device that includes two series capacitors.

According to certain embodiments, a laminate MEMS device is mounted to a power amplifier PCB. Copper vias and conductors are used to conduct high current RF through the LMEMS device. At the bottom left corner of the device shown in FIG. 6B, RF current enters the lower copper layer and proceeds through a via into the upper copper layer. When the magnet is in the "up" position as shown in FIG. 6B, a large separating air gap in the copper exists, creating an equivalent open circuit which prevents RF current from flowing to the output.

A layer of insulating silicon nitride (ceramic dielectric) is deposited on top of copper conductors. When the EM coil (shown in FIG. 6A) is energized, the magnet is latched in the "down" position (not shown) and the metal posts contact the silicon nitride. This forms two series capacitors as shown in FIG. 6C, and allows RF current to flow from input to output.

Using one or multiple switched capacitors and/or RF switches constructed of these high power laminate MEMS devices, a high power tunable matching network can be constructed that provides a wide range of reactances in order to optimize the frequency or linearity behavior of the power amplifier for the various designated operating bands and air interface technologies.

The individual laminate MEMS capacitors are constructed using two metal plates separated by a fixed dielectric layer. They are operated as two-state variable devices. By closing the plates together, the target capacitance is achieved. By opening or separating the plates, the capacitance of the element is greatly reduced, ideally to a negligible level. Since the physical configuration of the capacitor plates is changed to select one of the two capacitance states, no semiconductor switches or diodes are needed in the circuit to switch the capacitor states. Therefore another advantage of the laminate MEMS switched capacitor circuit is that there are no semiconductor switches or diodes in the circuit that could cause added insertion loss or linearity degradation.

Figure 7:
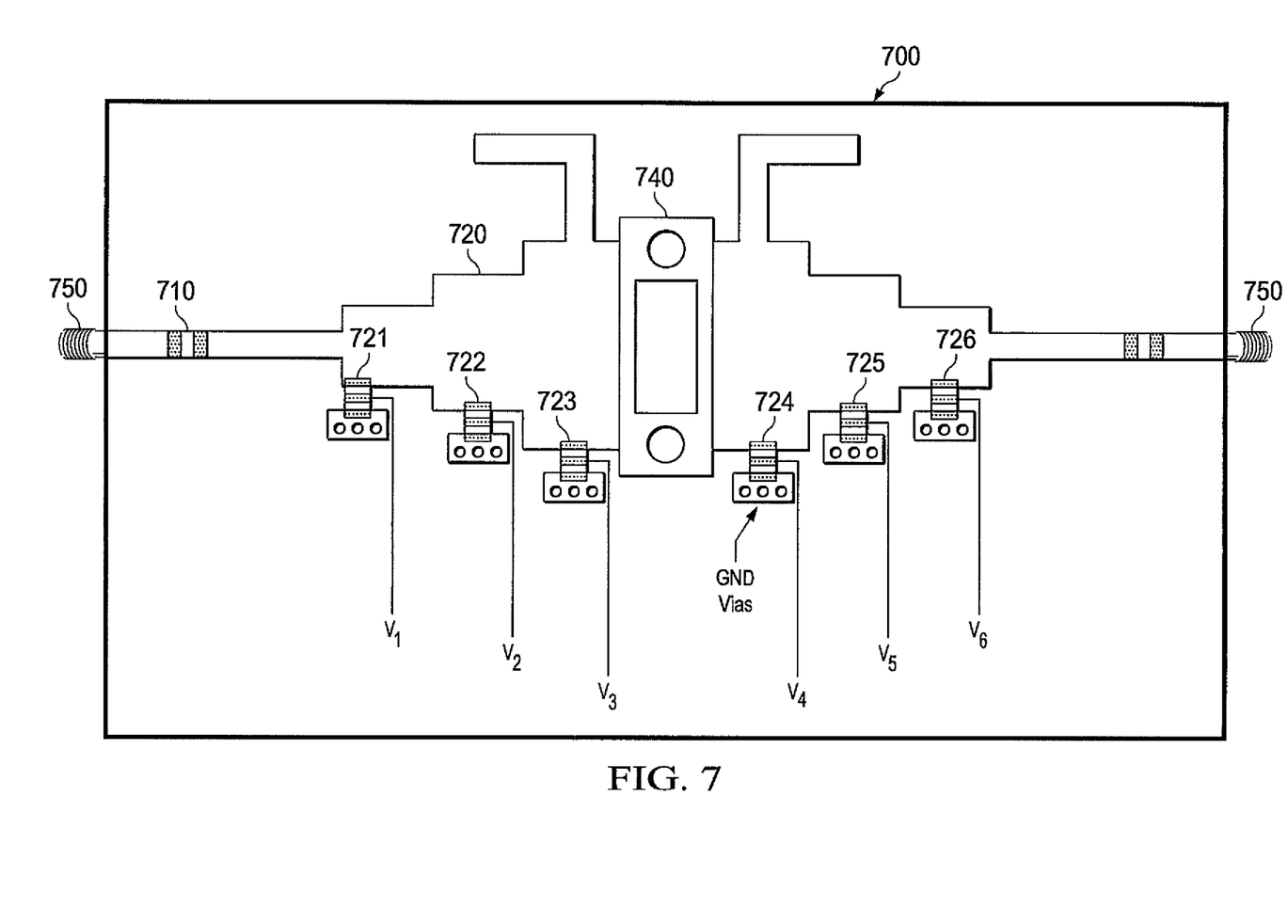
FIG. 7 illustrates a power amplifier circuit having a tunable matching network that uses individual laminate MEMS switchable capacitors according to an embodiment of the present disclosure.

FIG. 7 illustrates a power amplifier circuit having a tunable matching network (TMN) that uses individual switchable capacitors according to an embodiment of the present disclosure. PA circuit 700 is configured on a printed circuit board (e.g., PCB RO-4350) and includes one or more coupling capacitors 710 (e.g., ceramic capacitor 0402 or 0603), a TMN 720, a power amplifier transistor 740, and one or more end launch SMA connectors 750.

As shown in FIG. 7, TMN 720 includes a plurality of switchable laminate MEMS capacitors 721-726. Three switchable capacitors 721-723 are, used for input matching, and three switchable capacitors 724-726 are used for output matching. For each desired frequency band (e.g., approximately 865-894 MHz, 1930-1990 MHz, and 2500-2600 MHz), each capacitor 721-726 is switched into or out of circuit 700 in various combinations to achieve the optimal matching impedances for that band. This is achieved by opening or closing the capacitor plates of each MEMS capacitor 721-726. By providing impedance matching for discrete bands of spectrum, PA circuit 700 better serves the unique nature of cellular operators who do not own large swaths of spectrum due to FCC band allocations, and rather own multiple narrowband pieces of spectrum.

Although FIG. 7 illustrates one example of a PA circuit 700 for optimizing power amplifier performance, various changes may be made to FIG. 7. For example, while TMN 720 is depicted having six switchable laminate MEMS capacitors 721-726, other embodiments may include more or fewer MEMS capacitors.

Figure 8:
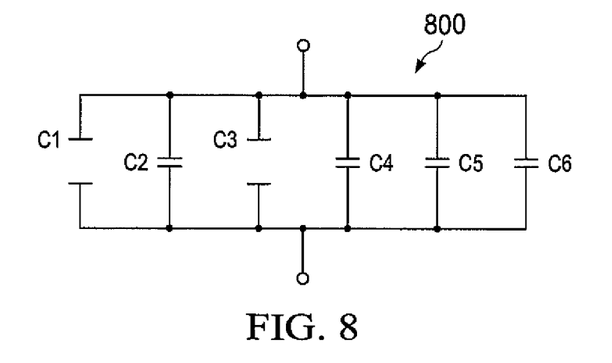
FIG. 8 illustrates a capacitor element in a tunable matching circuit according to an embodiment of the present disclosure.

FIG. 8 illustrates a capacitor element in a tunable matching circuit according to an embodiment of the present disclosure. Capacitor element 800 is constructed as a bank or array of individual switched laminate MEMS capacitors C1-C6. Each laminate MEMS capacitor C1-C6 has a separate control and can be individually switched from an open, low capacitance state to a closed, target capacitance state. For example, as shown in FIG. 8, capacitors C1 and C3 are in an open, low capacitance state, while capacitors C2, C4, C5, and C6 are in a closed, target capacitance state. A capacitor array such as capacitor element 800 may be used to select a specific capacitance value with high resolution over a wide total capacitance range with accuracy and repeatability.

In certain embodiments, the number of individual switched MEMS capacitors in each band is between four and eight. In other embodiments, the number of capacitors could be greater or fewer.

The capacitors may be configured to form a binary array. For example, capacitor element 800 includes capacitors C1-C6, where capacitor C1 has an actuated value of approximately 0.25 pF, capacitor C2 has an actuated value of approximately 0.5 pF, capacitor C3 1 pF, capacitor C4 2 pF, capacitor C5 4 pF, and capacitor C6 8 pF. All of these capacitors C1-C6 are arrayed in a parallel circuit and can be individually actuated. When actuated (closed), each capacitor C1-C6 sets itself to the fixed valued state. When not actuated (open), each capacitor C1-C6 has a negligibly small capacitance. By controlling each capacitor in capacitor element 800 individually using digital control, it is possible to select an overall capacitor value of between 0 pF and 15.75 pF in increments of 0.25 pF.

Although FIG. 8 illustrates one example of a capacitor element 800 having an array of MEMS capacitors, various changes may be made to FIG. 8. For example, the capacitors C1-C6 within capacitor element 800 are arrayed in increasing multiples of two, but the capacitor values may be set in any combination of values. As another example, capacitor element 800 may have more or fewer than six capacitors.

One advantage of using laminate MEMS capacitors is that they are constructed on a low cost PCB process and therefore can be either singulated into inexpensive varactor devices or can be integrated directly into the PCB design of the power amplifier. This latter approach may provide a circuit with minimal component requirements and superior parasitic characteristics. By implementing a binary array that is digitally controlled to achieve finite states, there is no variability in the capacitance setting and there is no susceptibility to phase modulation due to noise on the control lines. Therefore the repeatability is very high. Furthermore, since the laminate MEMS capacitors are physical capacitors, their capacitance has a low dependency on the RF power. Therefore the laminate MEMS capacitors are not highly susceptible to non-linearities or modulation from the waveform envelope. This results in virtually no EVM degradation.

By implementing a matching circuit consisting of laminate MEMS capacitor arrays, a wide tuning range can be achieved. The matching circuit insertion loss is minimized since the capacitor Q achievable is very high.

Figure 9:
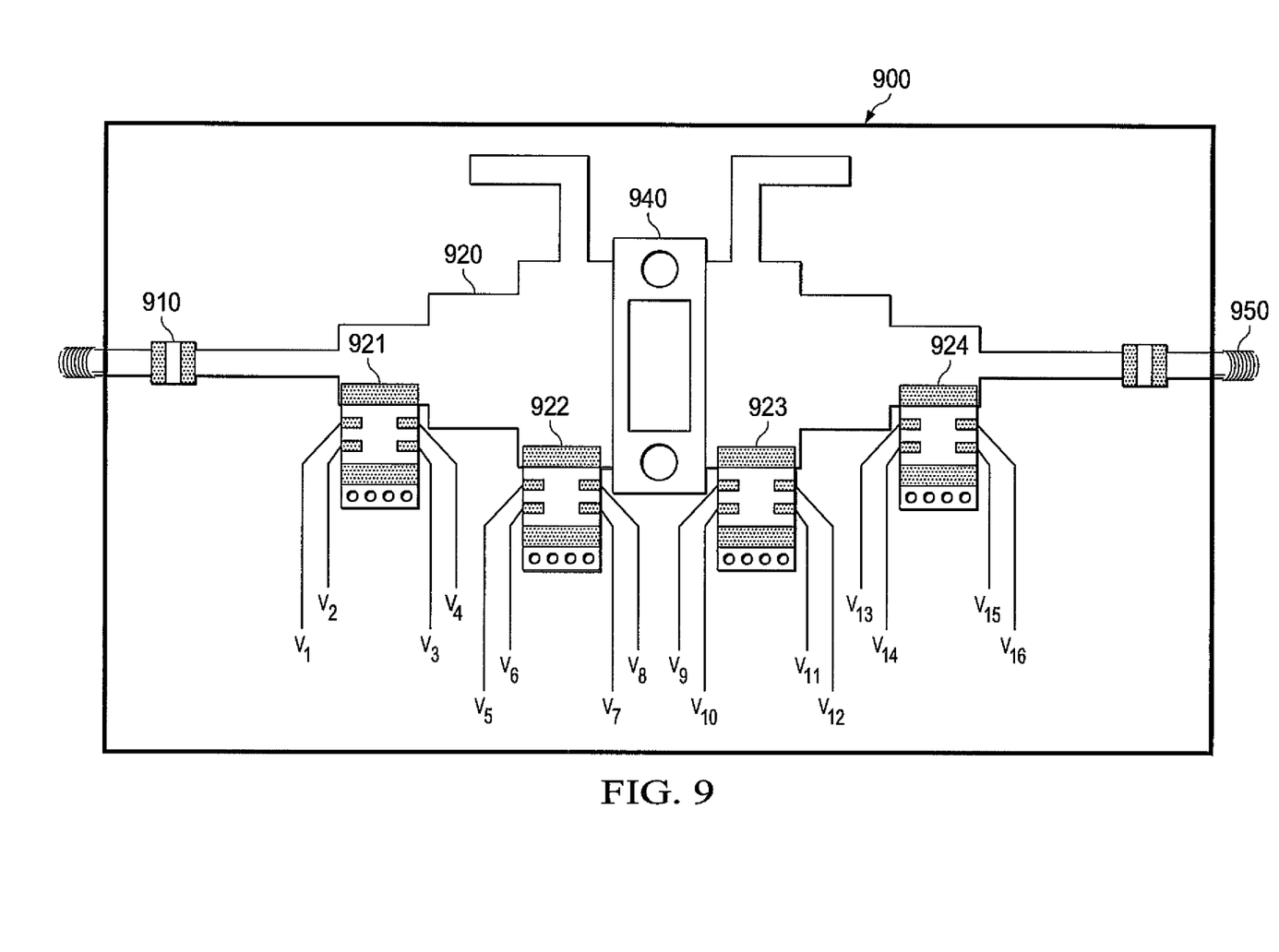
FIG. 9 illustrates a power amplifier circuit having a tunable matching network according on another embodiment of the present disclosure.

FIG. 9 illustrates a power amplifier circuit having a tunable matching network (TMN) according on another embodiment of the present disclosure. Similar to PA circuit 700 shown in FIG. 7, PA circuit 900 is configured on a printed circuit board (e.g., PCB RO-4350) and includes one or more coupling capacitors 910 (e.g., ceramic capacitor 0402 or 0603), a TMN 920, a power amplifier transistor 940, and one or more end launch SMA connectors 950.

TMN 920 includes a plurality of variable capacitor elements 921-924. Two capacitor elements 921, 922 are used for input matching, and two capacitor elements 923, 924 are used for output matching. As shown in FIG. 9, each capacitor element 921-924 is an array of MEMS capacitors, analogous to capacitor element 800 in FIG. 8, but with four capacitors instead of six. For each desired frequency band, each capacitor element 921-924 is set to a desired capacitance by opening or closing one or more of its four capacitors.

Although FIG. 9 illustrates one possible configuration of a power amplifier circuit that uses MEMS capacitor arrays, various changes may be made to FIG. 9. For example, each capacitor element 921-924 may have more or fewer than four capacitors. Furthermore, TMN 920 may include more or fewer than four capacitor elements 921-924.

Figure 10:
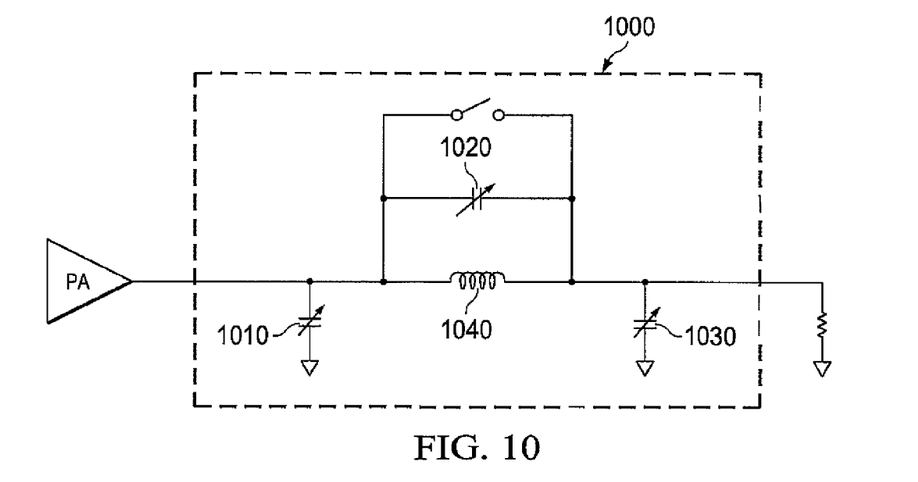
FIG. 10 illustrates a power amplifier matching circuit that uses laminate MEMS capacitors as contact switches or shunt switches, according to an embodiment of the present disclosure.

The switched laminate MEMS capacitors and capacitor arrays of the present disclosure may be implemented in a variety of matching circuit topologies to achieve an appropriate impedance transformation. For example, FIG. 10 illustrates a power amplifier matching circuit that uses laminate MEMS capacitors as contact switches or shunt switches, according to an embodiment of the present disclosure. Power amplifier matching circuit 1000 includes laminate MEMS capacitors 1010, 1020, and 1030 and inductor 1040. By switching capacitors 1010-1030 between open and closed states, it is possible to effectively switch inductor 1040 in and out of circuit 1000.

Figure 11:
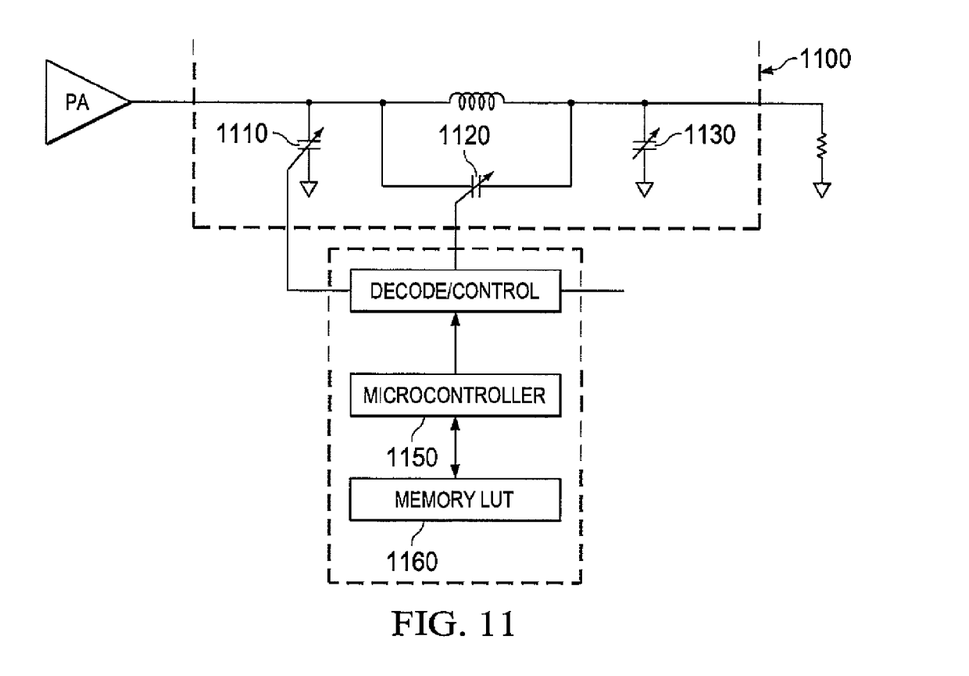
FIG. 11 illustrates use of a microprocessor with a memory look-up table to determine and set an ideal matching circuit according to embodiments of the present disclosure.

FIG. 11 illustrates use of a microprocessor or logical state machine with a memory look-up table (LUT) to determine and set an ideal matching circuit according to embodiments of the present disclosure. Matching circuit 1100 includes laminate MEMS capacitors 1110-1130. Settings for capacitors 1110-1130 are controlled by microcontroller or microprocessor or logical state machine 1150. The ideal settings for capacitors 1110-1130 can be determined for each frequency of operation and each waveform for a power amplifier circuit by searching through the various tunable elements states while measuring the power amplifier circuit performance. These capacitor settings or other tunable element states can then be stored in a memory device in the form of a look-up table (LUT) 1160 indexed by frequency, temperature, or any other suitable variables. When a specific frequency of operation is selected for example, microcontroller 1150 determines the matching circuit settings from LUT 1160 and programs capacitors 1110-1130 in matching circuit 1100 with these settings. It is noted that a microcontroller and look-up table may be used to control laminate MEMS capacitor arrays in other topologies as well, including TMN 920 in FIG. 9.

Figure 12:
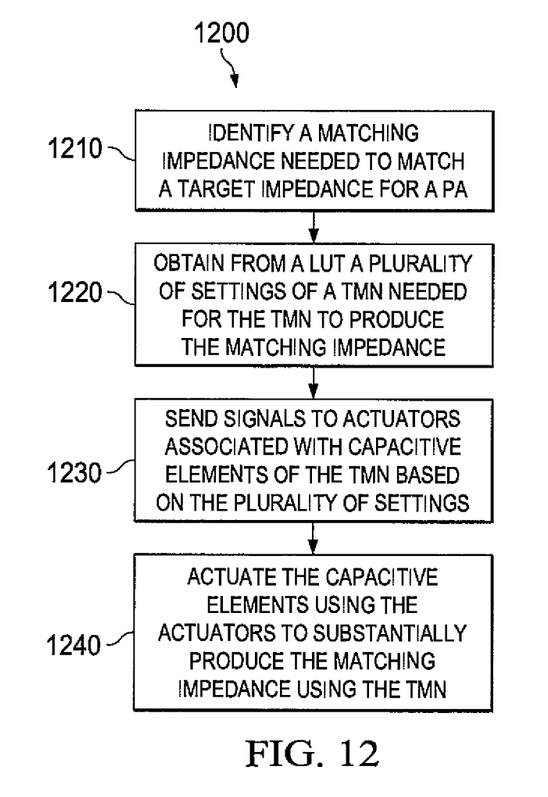
FIG. 12 illustrates a process for using a look-up table to control one or more capacitive elements in a tunable matching network according to an embodiment of the present disclosure.

FIG. 12 illustrates a process 1200 for using a LUT to control one or more capacitive elements in a TMN according to an embodiment of the present disclosure. In step 1210, a matching impedance is identified that is needed to match a target impedance for a PA. In step 1220, a plurality of settings for the TMN are obtained from a LUT. The plurality of settings are selected to produce a TMN with a matching impedance for the PA. The plurality of settings include a determination of states for the one or more capacitive elements. For example, the plurality of settings may direct some capacitive elements to be open and some other capacitive elements to be closed.

In step 1230, signals are sent to actuators associated with the capacitive elements of the TMN based on the plurality of settings. In step 1240, actuators actuate certain capacitive elements to substantially produce the matching impedance using the TMN.

Although FIG. 12 illustrates one example of a method 1200 for using a LUT to control one or more capacitive elements in a TMN, various changes may be made to FIG. 12. For example, while shown as a series of steps, various steps in FIG. 12 may overlap, occur in parallel, occur in a different order, or occur multiple times.

Since the embodiments of the laminate MEMS capacitor array matching circuit disclosed herein have a wide tuning range and high repeatability, these circuits may be used to construct a wideband power amplifier that is able to achieve optimum performance at any designated operating frequency that has been pre-calibrated into the controller LUT.

This approach has the potential to enable multi-band and multi-mode power amplifiers capable of supporting a wide frequency range from 700 MHz to 2700 MHz and which can be configured for virtually any wireless standard including GSM, EDGE, WCDMA, CDME, HSPA, and LTE. This product technology would be very attractive to network operators since this would support their wireless technology migration and de-risk their equipment investment.

Although the present disclosure has been described with an exemplary embodiment, various changes and modifications may be suggested to one skilled in the art. It is intended that the present disclosure encompass such changes and modifications as fall within the scope of the appended claims.

What is claimed is:

1. For use in a wireless network, a tunable power amplifier circuit comprising:
   a power amplifier transistor; and
   a plurality of laminate MEMS (microelectromechanical system) capacitors fabricated of printed circuit board (PCB) materials and coupled to the power amplifier transistor, the laminate MEMS capacitors arranged in a tunable matching network and configured to provide a matching impedance for the power amplifier transistor.

2. The tunable power amplifier circuit as set forth in claim 1, wherein the plurality of laminate MEMS capacitors form a laminate MEMS device configured to support peak power levels that exceed 200 watts.

3. The tunable power amplifier circuit as set forth in claim 1, wherein each of the laminate MEMS capacitors is individually configured to be actuated in one of an open state and a closed state.

4. The tunable power amplifier circuit as set forth in claim 1, wherein the plurality of laminate MEMS capacitors comprise a binary array of MEMS capacitors.

5. The tunable power amplifier circuit as set forth in claim 4, wherein a setting for each laminate MEMS capacitor in the binary array is determined according to at least one value in a look-up table.

6. The tunable power amplifier circuit as set forth in claim 1, wherein at least a first one of the laminate MEMS capacitors is coupled to an input of the power amplifier transistor and configured for input matching and at least a second one of the laminate MEMS capacitors is coupled to an output of the power amplifier transistor and configured for output matching.

7. The tunable power amplifier circuit as set forth in claim 1, wherein the laminate MEMS capacitors form a laminate MEMS device having length and width dimensions of approximately one-sixth of an inch.

8. The tunable power amplifier circuit as set forth in claim 2, wherein at least one of the laminate MEMS capacitors is configured as a shunt switch.

9. For use in a wireless network, a base station comprising:
   a base station controller; and
   a base transceiver subsystem having a tunable power amplifier circuit, the tunable power amplifier circuit comprising:
      a power amplifier transistor; and
      a plurality of laminate MEMS (microelectromechanical system) capacitors fabricated of printed circuit board (PCB) materials and coupled to the power amplifier transistor, the laminate MEMS capacitors arranged in a tunable matching network and configured to provide a matching impedance for the power amplifier transistor.

10. The base station as set forth in claim 9, wherein the plurality of laminate MEMS capacitors form a laminate MEMS device configured to support peak power levels that exceed 200 watts.

11. The base station as set forth in claim 9, wherein each of the laminate MEMS capacitors is individually configured to be actuated in one of an open state and a closed state.

12. The base station as set forth in claim 9, wherein the plurality of laminate MEMS capacitors comprise a binary array of MEMS capacitors.

13. The base station as set forth in claim 12, wherein a setting for each laminate MEMS capacitor in the binary array is determined according to at least one value in a look-up table.

14. The base station as set forth in claim 9, wherein at least a first one of the laminate MEMS capacitors is coupled to an input of the power amplifier transistor and configured for input matching and at least a second one of the laminate MEMS capacitors is coupled to an output of the power amplifier transistor and configured for output matching.

15. The base station as set forth in claim 9, wherein the laminate MEMS capacitors form a laminate MEMS device having length and width dimensions of approximately one-sixth of an inch.

16. The base station as set forth in claim 10, wherein at least one of the laminate MEMS capacitors is configured as a shunt switch.

17. For use in a wireless communication network, a method of providing a matching impedance for a tunable power amplifier, the method comprising:
   actuating at least one of a first plurality of laminate MEMS (microelectromechanical system) capacitors coupled to an input of a power amplifier transistor; and
   actuating at least one of a second plurality of laminate MEMS capacitors coupled to an output of the power amplifier transistor,
   wherein the first and second pluralities of laminate MEMS capacitors are fabricated of printed circuit board (PCB) materials and are arranged in a tunable matching network.

18. The method as set forth in claim 17, wherein the first and second pluralities of laminate MEMS capacitors form a laminate MEMS device configured to support peak power levels that exceed 200 watts.

19. The method as set forth in claim 17, wherein the first plurality of laminate MEMS capacitors comprise a first binary array of laminate MEMS capacitors and the second plurality of laminate MEMS capacitors comprise a second binary array of laminate MEMS capacitors.

20. The method as set forth in claim 19, further comprising:
   determining a setting for each laminate MEMS capacitor in the first and second binary arrays based on at least one value in a look-up table; and
   actuating at least one of the laminate MEMS capacitors into one of an open state and a closed state based on the at least on value in the look-up table.

* * * * *